(12) United States Patent
Ho et al.

(10) Patent No.: US 11,446,776 B2
(45) Date of Patent: Sep. 20, 2022

(54) METHOD FOR ASSEMBLING A HOLLOW CORE OPTICAL FIBER ARRAY LAUNCHER

(71) Applicant: NORTHROP GRUMMAN SYSTEMS CORPORATION, Falls Church, VA (US)

(72) Inventors: James G Ho, Los Angeles, CA (US); Joseph M Harkenrider, Sugar Land, TX (US); Dustin Guenther, La Mirada, CA (US); Gregory D Goodno, Los Angeles, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 166 days.

(21) Appl. No.: 17/004,072

(22) Filed: Aug. 27, 2020

(65) Prior Publication Data

US 2022/0063031 A1  Mar. 3, 2022

(51) Int. Cl.
*H04B 10/00* (2013.01)
*B23P 19/10* (2006.01)
*G02B 6/42* (2006.01)

(52) U.S. Cl.
CPC .............. *B23P 19/10* (2013.01); *G02B 6/424* (2013.01); *G02B 6/4227* (2013.01); *G02B 6/4239* (2013.01); *G02B 6/4244* (2013.01)

(58) Field of Classification Search
CPC combination set(s) only.
See application file for complete search history.

(56) References Cited

U.S. PATENT DOCUMENTS 5,241,612 A * 8/1993 Iwama .................... G02B 6/32
                                                      385/74
5,346,583 A * 9/1994 Basavanhally ........ G02B 6/322
                                                      216/60

(Continued)

FOREIGN PATENT DOCUMENTS

DE    29816108 U1     1/1999
DE    19840935 A1 *   3/2000  ............... G02B 6/32

(Continued)

OTHER PUBLICATIONS

Mattia Michieletto, Jens K. Lyngsø, Christian Jakobsen, Jesper Lægsgaard, Ole Bang, and Thomas T. Alkeskjold, "Hollow-core fibers for high power pulse delivery," Optics Express vol. 24, No. 7, pp. 7103-7119 (2016).

(Continued)

*Primary Examiner* — Agustin Bello
(74) *Attorney, Agent, or Firm* — John A. Miller; Shumaker, Loop & Kendrick, LLP

(57) ABSTRACT

A method for assembling a beam combiner array including providing an array block having a back wall, a front surface and a plurality of aligned channels extending from the back wall to the front surface, where a bore extends through the back wall and into each channel, and providing a lens array including a plurality of lenses. The method further includes securing the lens array to the front surface of the block so that one of the lenses is aligned with each channel and threading a separate hollow core fiber through one of the bores in the back wall so that an end of the fiber is positioned within the channel. The method also includes aligning each fiber to the lens array so that a beam that propagates down the fiber is emitted into the channel, focused by the lens and emitted from the array as a collimated beam.

19 Claims, 9 Drawing Sheets

(56) References Cited

U.S. PATENT DOCUMENTS

| | | | |
|---|---|---|---|
| 5,518,863 A * | 5/1996 | Pawluczyk | G02B 3/005 385/119 |
| 5,528,724 A * | 6/1996 | Chang | G02B 6/2817 385/38 |
| 5,604,830 A * | 2/1997 | Kuder | G02B 6/3885 385/71 |
| 5,859,945 A * | 1/1999 | Kato | G02B 6/4215 385/33 |
| 5,879,571 A * | 3/1999 | Kalman | G02B 6/4249 216/41 |
| 5,943,463 A * | 8/1999 | Unuma | H04N 1/486 385/119 |
| 6,220,058 B1 | 4/2001 | Koyama et al. | |
| 6,304,694 B1 * | 10/2001 | Ford | G02B 6/32 385/35 |
| 6,328,482 B1 * | 12/2001 | Jian | G02B 6/423 385/33 |
| 6,452,726 B1 * | 9/2002 | Mandella | G11B 7/1387 359/708 |
| 6,621,976 B2 * | 9/2003 | Han | G02B 6/3636 385/137 |
| 6,633,700 B2 * | 10/2003 | Bellman | G02B 6/3582 385/119 |
| 6,643,068 B2 * | 11/2003 | Mandella | G02B 21/02 359/708 |
| 6,737,223 B2 * | 5/2004 | Steinberg | G02B 6/4204 216/26 |
| 6,766,076 B2 * | 7/2004 | Nakama | G02B 6/32 385/33 |
| 6,827,500 B2 * | 12/2004 | Basavanhally | G02B 6/3878 385/80 |
| 6,829,421 B2 * | 12/2004 | Forbes | G02B 6/02371 385/124 |
| 6,836,602 B2 * | 12/2004 | Filhaber | G02B 6/4236 385/60 |
| 6,868,206 B2 * | 3/2005 | Martin | G02B 6/4249 385/119 |
| 6,931,177 B2 * | 8/2005 | Suzuki | G02B 6/32 385/33 |
| 6,981,804 B2 * | 1/2006 | Jian | G02B 6/423 385/88 |
| 7,058,275 B2 * | 6/2006 | Sezerman | G02B 6/3636 385/115 |
| 7,236,665 B2 * | 6/2007 | Kobayashi | G02B 6/3644 385/119 |
| 7,242,835 B2 * | 7/2007 | Busse | G02B 6/262 385/139 |
| 7,260,299 B1 * | 8/2007 | Di Teodoro | H01S 3/06758 385/125 |
| 7,373,062 B2 * | 5/2008 | Huber | G02B 6/3849 385/125 |
| 7,375,877 B1 * | 5/2008 | Di Teodoro | G02B 6/3853 359/341.41 |
| 7,379,648 B1 * | 5/2008 | Brooks | G02B 6/3853 385/126 |
| 7,391,561 B2 * | 6/2008 | Di Teodoro | G02B 6/02347 359/341.1 |
| 7,393,143 B2 * | 7/2008 | Kato | G02B 6/3846 385/98 |
| 7,424,183 B2 * | 9/2008 | Akashi | G02B 6/29313 385/33 |
| 7,555,184 B2 * | 6/2009 | Kurosawa | G02B 6/3861 385/123 |
| 7,703,989 B2 * | 4/2010 | Kato | G02B 6/3846 385/73 |
| 7,940,465 B2 * | 5/2011 | Corem | G02B 27/0961 359/619 |
| 8,472,769 B2 * | 6/2013 | Tachikura | G02B 6/02385 385/125 |
| 8,503,840 B2 * | 8/2013 | Hu | G02B 6/2726 385/38 |
| 8,526,110 B1 * | 9/2013 | Honea | H01S 3/2391 359/556 |
| 9,091,817 B2 * | 7/2015 | Wagener | G02B 6/3512 |
| 9,182,648 B2 * | 11/2015 | Ai | G02B 3/0037 |
| 9,366,872 B2 * | 6/2016 | Honea | G02B 27/30 |
| 9,964,699 B2 * | 5/2018 | Chen | G02B 6/262 |
| 10,495,820 B1 * | 12/2019 | Whaley | G02B 6/3636 |
| 10,551,583 B1 * | 2/2020 | Stone | G02B 6/06 |
| 10,620,446 B1 * | 4/2020 | Ho | G02B 27/1073 |
| 11,125,950 B2 * | 9/2021 | Watanabe | G02B 6/3885 |
| 11,143,820 B2 * | 10/2021 | Tsunoda | G02B 6/36 |
| 11,269,136 B1 * | 3/2022 | Ho | G02B 27/10 |
| 2002/0131700 A1 * | 9/2002 | Nakama | G02B 6/3644 385/33 |
| 2003/0043472 A1 * | 3/2003 | Mandella | G01Q 60/22 385/33 |
| 2003/0128437 A1 * | 7/2003 | Sato | G02B 6/32 385/33 |
| 2003/0142909 A1 * | 7/2003 | Suzuki | G02B 6/3672 385/33 |
| 2003/0231829 A1 * | 12/2003 | Meyers | G02B 6/4212 385/33 |
| 2004/0258381 A1 * | 12/2004 | Borrelli | G02B 6/04 385/125 |
| 2006/0165351 A1 * | 7/2006 | Hamanaka | G02B 6/4249 385/33 |
| 2006/0204195 A1 * | 9/2006 | Kurosawa | G02B 6/255 385/98 |
| 2009/0010603 A1 * | 1/2009 | Sugioka | G02B 6/30 524/401 |
| 2012/0045169 A1 * | 2/2012 | Hu | G02B 6/262 385/115 |
| 2012/0051688 A1 * | 3/2012 | Pitwon | H05K 1/0274 359/341.32 |
| 2013/0084039 A1 * | 4/2013 | Doany | H01L 21/302 438/31 |
| 2013/0089289 A1 * | 4/2013 | Sorin | G02B 6/43 385/33 |
| 2015/0234195 A1 * | 8/2015 | Honea | G02B 27/0905 359/618 |
| 2019/0113679 A1 * | 4/2019 | Schwarz | B23K 26/0624 |
| 2020/0127601 A1 * | 4/2020 | Towe | F24S 23/12 |
| 2021/0103152 A1 * | 4/2021 | Goodno | H01S 3/1618 |
| 2021/0286140 A1 * | 9/2021 | Winzer | G02B 6/30 |
| 2022/0063031 A1 * | 3/2022 | Ho | H01S 5/02476 |
| 2022/0066094 A1 * | 3/2022 | Ho | G02B 27/30 |
| 2022/0069537 A1 * | 3/2022 | Travers | G02F 1/365 |

FOREIGN PATENT DOCUMENTS

| | | | | |
|---|---|---|---|---|
| DE | 19840935 B4 * | 6/2004 | | G02B 6/32 |
| DE | 19610881 B4 * | 1/2008 | | G02B 6/4204 |
| DE | 2017114002 A1 | 12/2018 | | |
| DE | 102017114002 A1 * | 12/2018 | | G02B 6/4204 |
| WO | 200001458 A2 | 3/2000 | | |
| WO | WO-2018234081 A * | 12/2018 | | G02B 6/4204 |

OTHER PUBLICATIONS

G. Palma-Vega, F. Beier, F. Stutzki, S. Fabian, T. Schreiber, R. Eberhardt, and A. Tünnermann, "High Average Power Transmission Through Hollow-core Fibers," in OSA Laser Congress (2018).

Douglas S. Hobbs, Bruce D. MacLeod, and Ernest Sabatino III "Continued advancement of laser damage resistant optically functional microstructures", Proc. SPIE vol. 8530, Laser-Induced Damage in Optical Materials: 2012, 85300O (Dec. 4, 2012) pp. 1-22, TelAztec LLC, Burlington, MA.

"RAR Nano-Textured Optics" RAR Technology, Jan. 2018, p. 1, TelAztec Burlington, MA.

* cited by examiner

METHOD FOR ASSEMBLING A HOLLOW CORE OPTICAL FIBER ARRAY LAUNCHER

BACKGROUND

Field

This disclosure relates generally to a method for assembling a hollow core optical fiber array launcher assembly and, more particularly, to a method for assembling a hollow core optical fiber array launcher assembly that includes providing an optical block having a plurality of parallel sealed channels, securing a lens array to a front surface of the block so that one of the lenses in the array is aligned with each channel, threading a separate hollow core fiber through a bore in a back wall of the block so that an end of the fiber is positioned within the channel, and aligning each fiber to the lens array in an x-y-z direction so that a beam that propagates down the fiber is emitted into the channel, focused by the lens and emitted from the assembly as a collimated beam.

Discussion

Directed energy (DE) systems that direct a high energy optical beam to a target are rapidly being realized in real-world operational environments. Reliable, robust and efficient beam delivery of individual multi-kW class lasers and high energy and peak power pulsed illuminators to remote beam directors and combiners are key driving elements for DE systems. Fiber laser amplifiers have proven to be desirable as energy sources for DE systems because of their high efficiency, high power scalability and excellent beam quality. Fiber laser systems employ multiple fiber laser amplifiers that combine the amplified beams in some fashion to generate higher powers. A design challenge for fiber laser amplifier systems of this type is to combine the beams from a plurality of fiber amplifiers in a manner so that the beams provide a single beam output having a uniform phase over the beam diameter such that the beam can be focused to a small focal spot, where focusing the combined beam to a small spot at a long distance (far-field) defines the quality of the beam.

There are two general approaches for scaling beam combiner systems to higher powers. One approach is known as spectral beam combining (SBC), where multiple lasers of different wavelengths are combined on a diffraction grating or other dispersive optic into a single beam. The other approach is known as coherent beam combining (CBC), where multiple mutually coherent lasers are locked in phase with one another and combined into a single beam either by overlapping in the near field using a beam splitter, or by tiling side by side to form a composite beam, a configuration that is colloquially referred to as a "phased array".

Conventional single mode and large mode area (LMA) fiber technology is limited by nonlinear effects when fiber lengths are more than a few meters at multiple-kW optical power levels. This limitation places sever size and weight constrains in high-power laser system architecture, for example, DE weapons applications, where it is desirable to deliver laser beams to distances of 10's of meters without using free space optics.

Hollow core (HC) fiber technology has proven to be an ideal solution to overcome the nonlinear effects of traditional fiber technology. Hollow core fibers guide the optical mode based on photonic bandgap principles, instead of index of refraction gradient. A hollow core fiber light guiding core consists of >90% air, which reduces the nonlinear effects of fused silica proportionally. Current state of the art hollow core fibers have shown to be capable of delivering kW level average powers and 100's kW peak powers with low loss (<0.03 dB/m, with a path to even lower) and minimal nonlinearity. Development work has mainly been focused on the fiber itself rather than the termination and ability to couple into these fibers efficiently, both critical aspects of DE systems.

The unique structure of hollow core fibers requires additional considerations because the air core at the end of the fiber is open to the environment. If the end is not sealed, even a small amount of contamination can result in thermal destruction due to absorption from the high intensity beam. However, an open hollow core fiber end that is terminated with a high quality cleave would deliver a flat wave front free-space beam. This termination would have minimum reflection and distortion due to good impedance match to air (from >90% air guiding core). If the air core of the fiber is sealed with a fused silica block, such as an end cap, the environmental contamination issue can potentially be eliminated. However, the process of jointing the fiber to the end cap introduces two additional issues to this interface. Particularly, contamination can be 'locked in" during the jointing process of glass fusing with various heating techniques, some with electrodes that emit carbon or metal, and during glass fusing, melting of both the hollow core fiber and the endcap introduces length uncertainty between the multiple air cores that make up the guide region. Subsequently, the free-space propagating beam wave front cannot be consistently reproduced with high certainty. This problem impacts performance in a fiber array where the wave fronts need to be matched.

DETAILED DESCRIPTION OF THE EMBODIMENTS

The following discussion of the embodiments of the disclosure directed to a method for assembling a hollow core optical fiber array launcher assembly is merely exemplary in nature, and is in no way intended to limit the disclosure or its applications or uses. For example, the hollow core optical fiber array launcher assembly has particular application as a beam emitter in a CBC or an SBC fiber laser amplifier system. However, as will be appreciated by those skilled in the art, the hollow core optical fiber array launcher assembly may have application for other optical systems.

Figure 1:
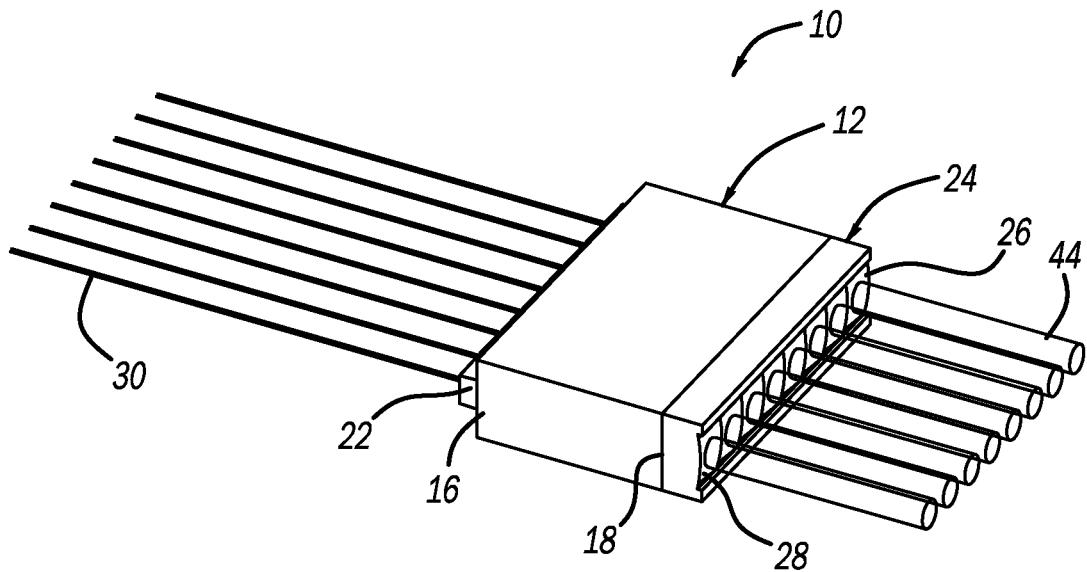
FIG. 1 is an isometric type view of a 1D beam combiner array assembly.
Figure 2:
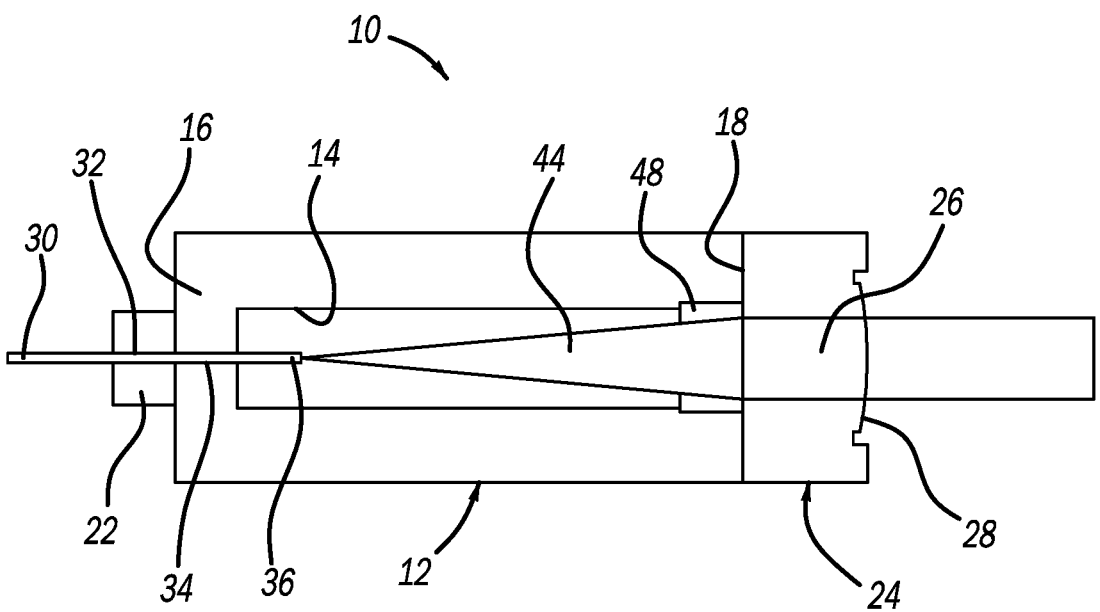
FIG. 2 is a side cross-sectional type view of the 1D beam combiner array assembly.

FIG. 1 is an isometric type view and FIG. 2 is a side cross-sectional type view of a 1D beam combiner array assembly 10 that has application for both spectral and coherent beam combining for high power or direct energy laser weapon systems. The assembly 10 includes a monolithic array block 12 made of, for example, glass or other suitable optical material, and including a series of parallel, sealed and optically separated cylindrical channels 14 extending from a back wall 16 of the block 12 having a certain thickness to a cavity 20 open to a front surface 18 of the block 12. A series of spaced apart fiber flanges 22 are coupled by, for example, glue to a back surface of the back wall 16 and a monolithic beam shaper lens array 24 is optically coupled by, for example, glue to the front surface 18 and includes an array of lenses 26, where a separate one of the flanges 22 and a separate one of the lens 26 are aligned with each one of the channels 14. An anti-reflection (AR) coating or nano-texture AR surface 28 can be provided on an input surface and an output surface of the lens array 24 to reduce beam reflection.

Figure 3:
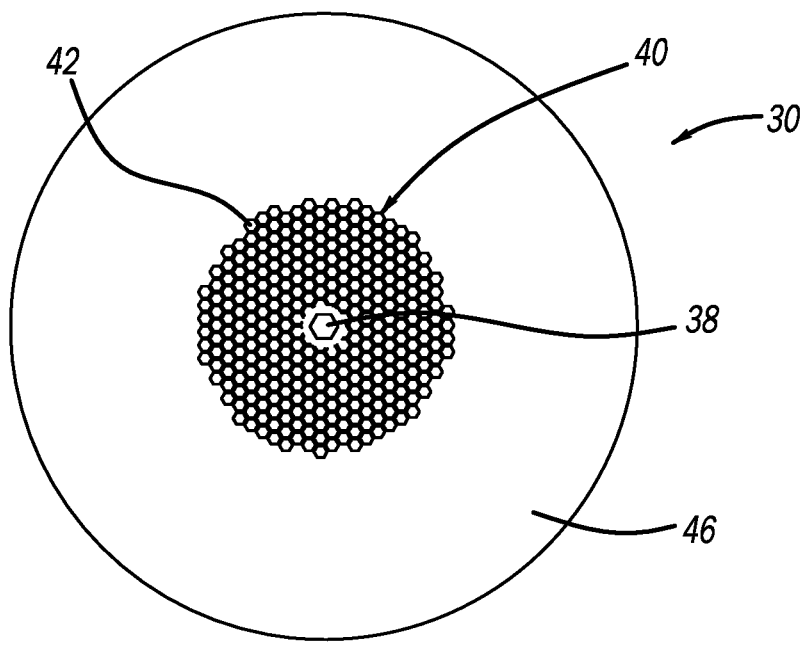
FIG. 3 is a cross-sectional view of a hollow core fiber used in the beam combiner array assembly.
Figure 4:
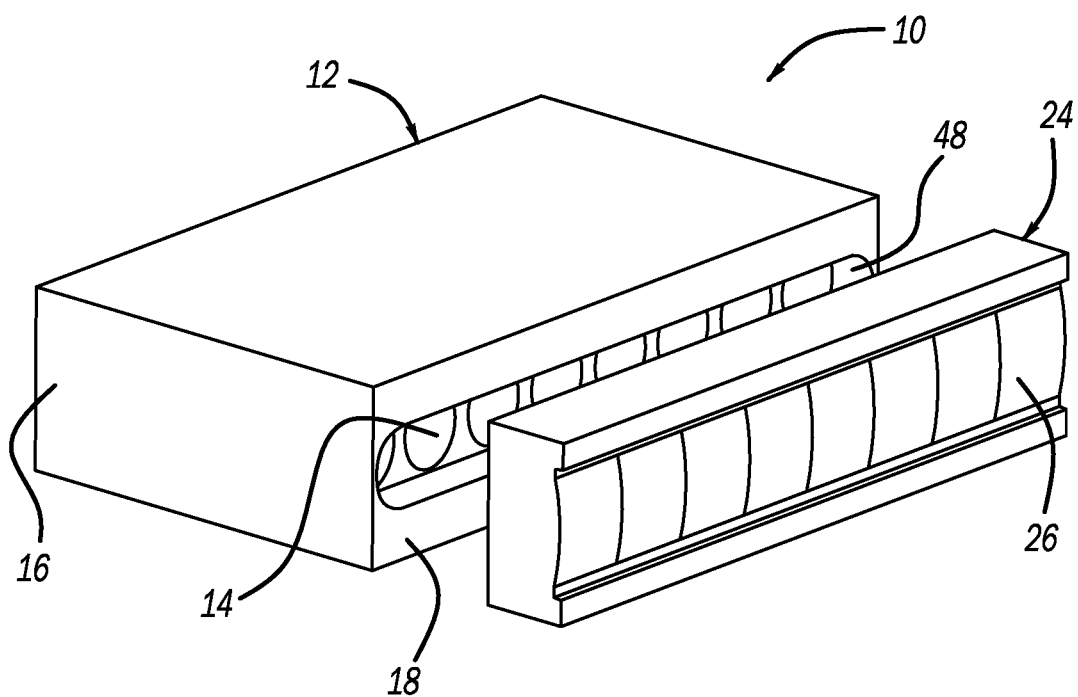
FIG. 4-8 show assembly steps of the beam combiner array assembly.
Figure 5:
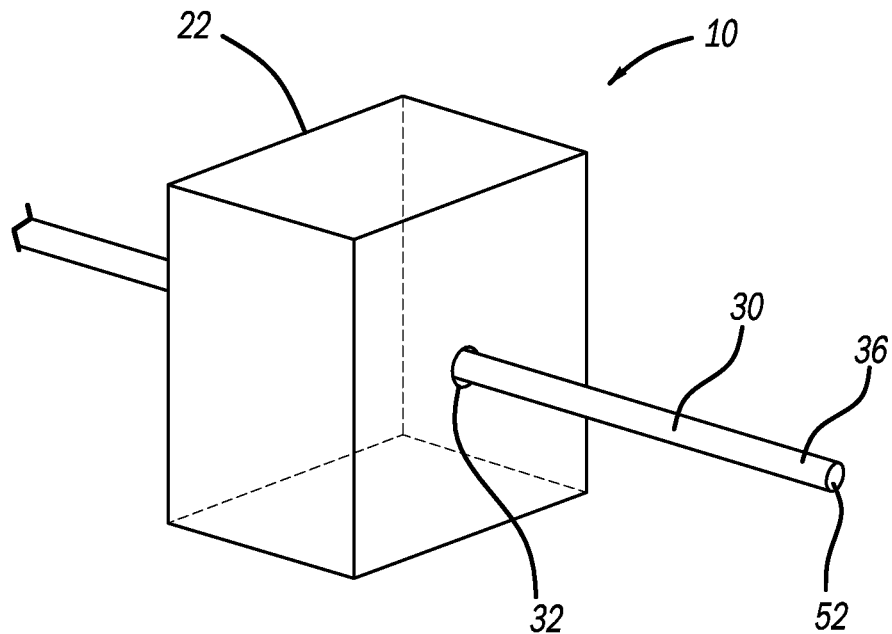
Figure 6:
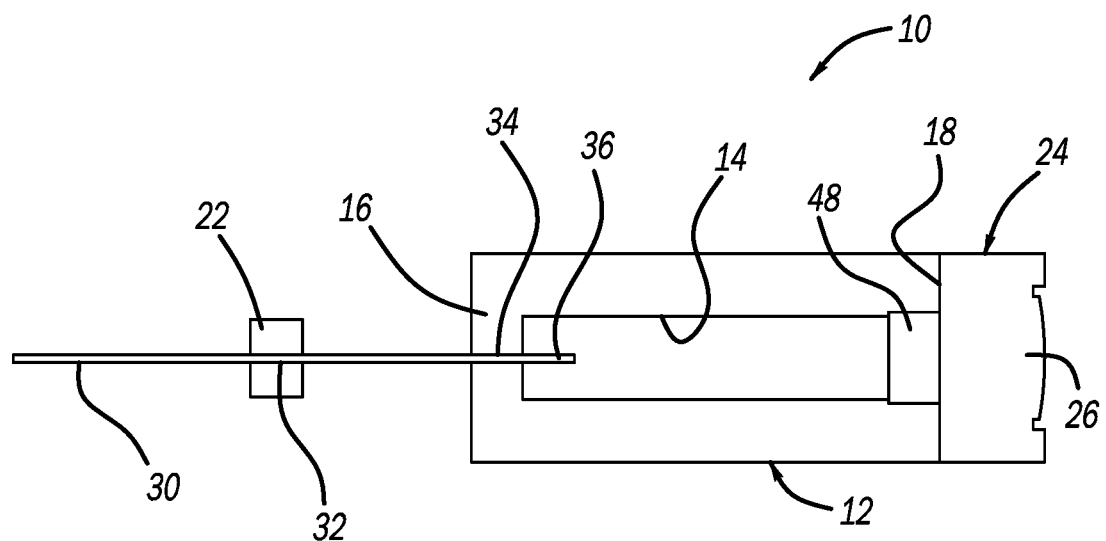

A separate hollow core fiber 30 extends through an orifice 32 in each of the flanges 22 and an orifice 34 in the back wall 16 of the block 12 and is secured thereto so that an end 36 of the fiber 30 is positioned in the channel 14 at a focal point of the associated lens 26, where the fiber 30 can be of any design suitable for the purposes discussed herein and where there are eight fibers 30 in this embodiment. FIG. 3 is a cross-sectional view of one of the hollow core fibers 30 showing one non-limiting design. The fiber 30 includes a central hollow core 38 filled with air or other gas surrounded by a cladding layer 40 made up of a honeycomb array of hexagonal shaped hollow tubes 42 filled with the same or similar gas to provide a higher index of refraction than the gas in the core 38 so as to confine an optical beam 44 mostly within the core 38 as it propagates down the fiber 30. The cladding layer 40 is surrounded by a solid glass outer protective layer 46. When the optical beam 44 propagates down the fiber 30 and is emitted from the end 36 of the fiber 30 into free space into the channel 14, it is focused by the lens 26 to be collimated in combination with the other beams to generate a combined high power output beam. The lenses 26 are closely space together to provide a compact output beam, where the pitch between the lenses 26 may be 1-2 mm. The lenses 26 can be configured to shape the beam 44 in any desirable manner including changing the spatial phase distribution, or wavefront, of the beam 44, for example, to a square beam to increase beam fill factor.

It is noted that in an alternate embodiment the block 12 can have a single open space that all of the beams 44 propagate through instead of the separate channels 14. However, since it is desirable from a reliability stand point to reduce as much contamination of the beams 44 as possible, the separate channels 14 would be more desirable. It is desirable that the fibers 30, the array block 12 and the lens array 24 be made out of the same material so that thermal effects on the assembly 10 are consistent and don't affect beam quality. Further, it is desirable to make the array block 12 out of an optically transparent material, such as glass, so that any scattered light in the channels 14 propagates out of the block 12 and does not heat the block 12.

In order to obtain high beam quality and output power, it is necessary that the orientation of the fibers 30 in all of the x-y-z directions, where the z direction is along the propagation direction of the beam 44, be very accurate and precise so that there is no tilt to the end 36 of the fiber 30 and the end 36 of the fiber 30 is at the desired focal point location in the channel 14 so that the beam 44 is emitted from the end 36 of the fiber 30 exactly parallel to all of the other beams. The following discussion referencing FIGS. 4-8 showing assembly steps of the beam combiner array assembly 10 is one non-limiting embodiment for assembling the beam combiner array assembly 10 to provide the desired precision, where many of the assembly steps can be automated and performed by robotics.

The block 12 and the lens array 24 are separately fabricated as monolithic elements by machining a separate suitable block of optical material, such as glass, in any suitable manner to form the channels 14 and the lenses 26. The block 12 and the lens array 24 are then aligned and glued together along the front surface 18 of the block 12, where the position of the array 24 will determine the position of the ends 36 of the fibers 30, see FIG. 4. Each fiber 30 is then slid through the orifice 32 in its respective flange 22, where the diameter of the orifice 32 is slightly larger than the outer diameter of the fiber 30, and the end 36 of each fiber 30 is cleaved to form a clean front end surface 52 for the guide optical mode to propagate out of the fiber 30 into free space, see FIG. 5. The end 36 of each fiber 30 is then slid through its respective orifice 34 in the back wall 16 of the block 12 so that the fiber 30 extends into the respective channel 14, see FIG. 6. The diameter of the orifice 34 is larger than the diameter of the fiber 30 by an amount so that a robot (not shown) can be used to insert the fiber 30 through the orifice 34 so that the fiber end surface 52 does not touch the block 12 to prevent contamination.

Figure 7:
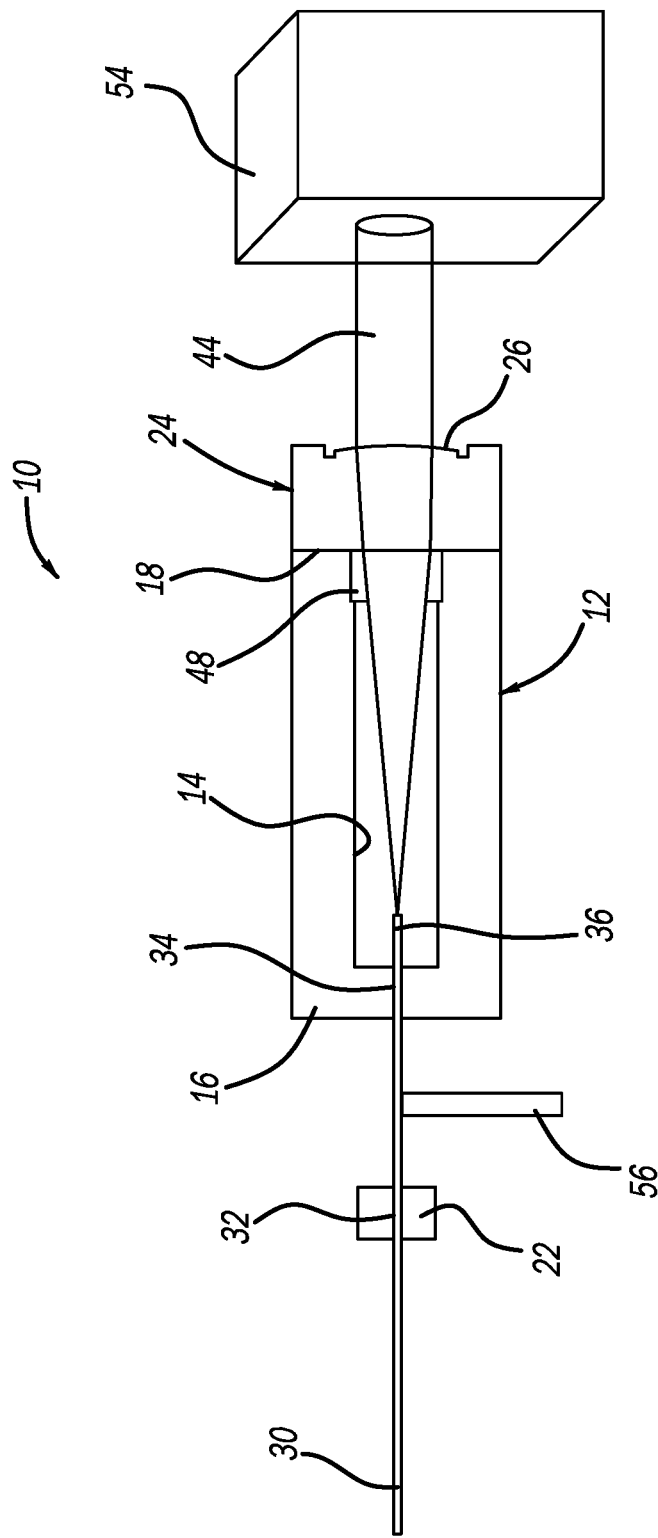
Figure 8:
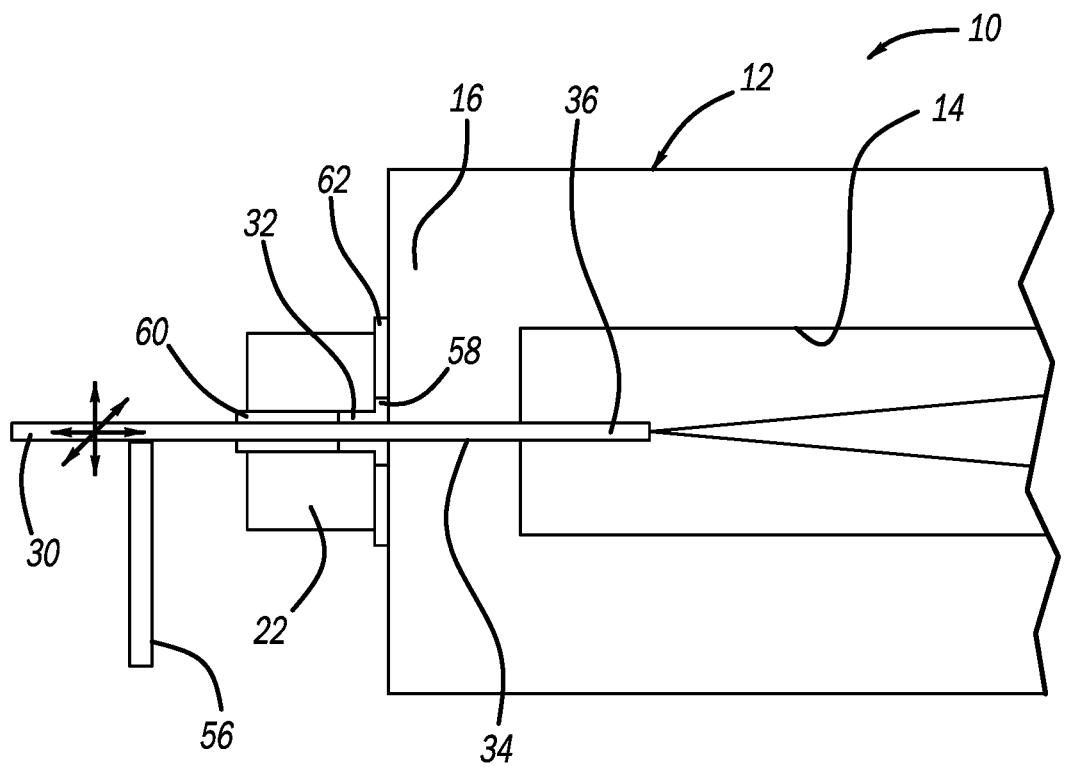

The assembly 10 as it stands so far is then placed in a fixture (not shown) provided relative to laser beam diagnostic equipment 54 that provides a global reference and the beam 44 is sent down the fiber 30 so that it impinges the equipment 54, see FIG. 7. A translator 56 movable in the x, y and z directions is coupled to the fiber 30 and is moved in each direction, where the intensity of the beam 44 is analyzed by the equipment 54 to precisely position the end 36 of the fiber 30 with the proper orientation, and the fiber 30 is held in this position. The flange 22 is slid along the fiber 30 towards the array block 12 until it contacts the back wall 16 of the block 12, and then is slid back some distance to provide a glue gap 58 therebetween, and the fiber 30 is then glued to the flange 22 while it is in this position using glue 60, see FIG. 8. Glue 62 is applied in the glue gap 58 and a final fine tune alignment between the fiber 30 and the block 12 is performed using the equipment 54, and then the glue 62 is dried or cured so that the channel 14 is sealed. Each fiber 30 is sequentially coupled to and aligned with the block 12 in this manner.

Figure 9:
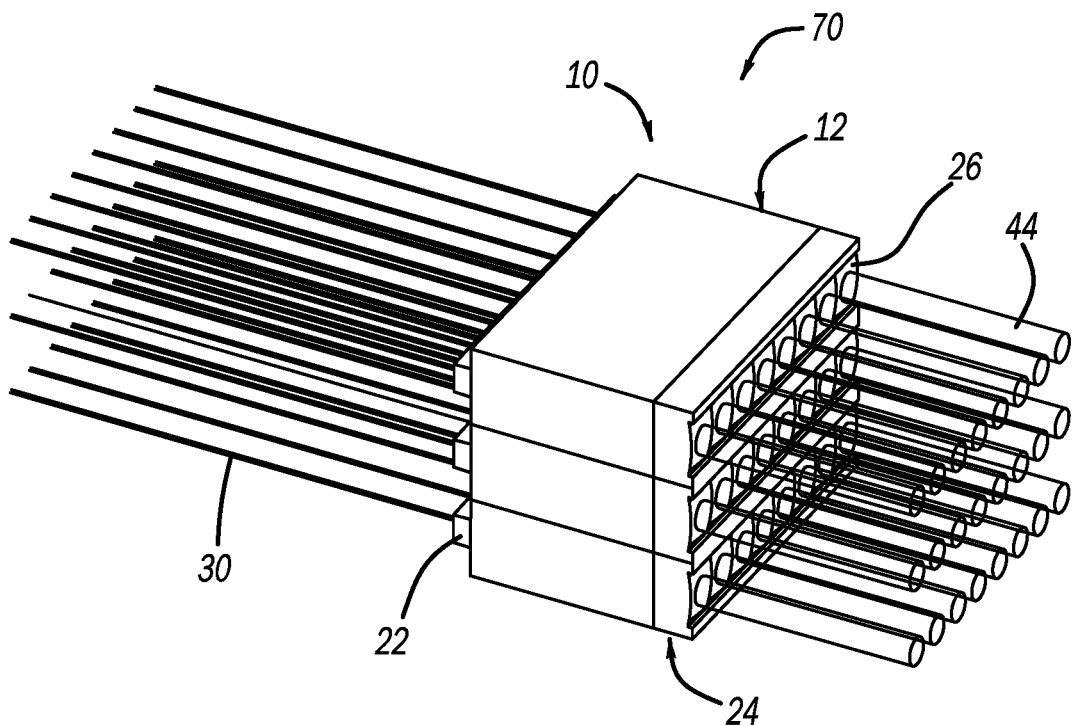
FIG. 9 is an isometric view of a 2D beam combiner array assembly.

The beam combiner array assembly 10 is a 1D array. However, multiple 1D assemblies can be stacked and coupled together to make a 2D beam combiner array assembly. For example, three of the assemblies 10 can be coupled together to define a 3×8 array assembly 70, as shown in FIG. 9, where the blocks 12 in each assembly 10 are glued together after being aligned by the equipment 54.

As mentioned above, the beam combiner array assembly 10 can be used in spectra and coherent beam combining fiber laser amplifier systems. The following discussion refers to various examples of the assembly 10 being used in various embodiments of these types of systems.

Figure 10:
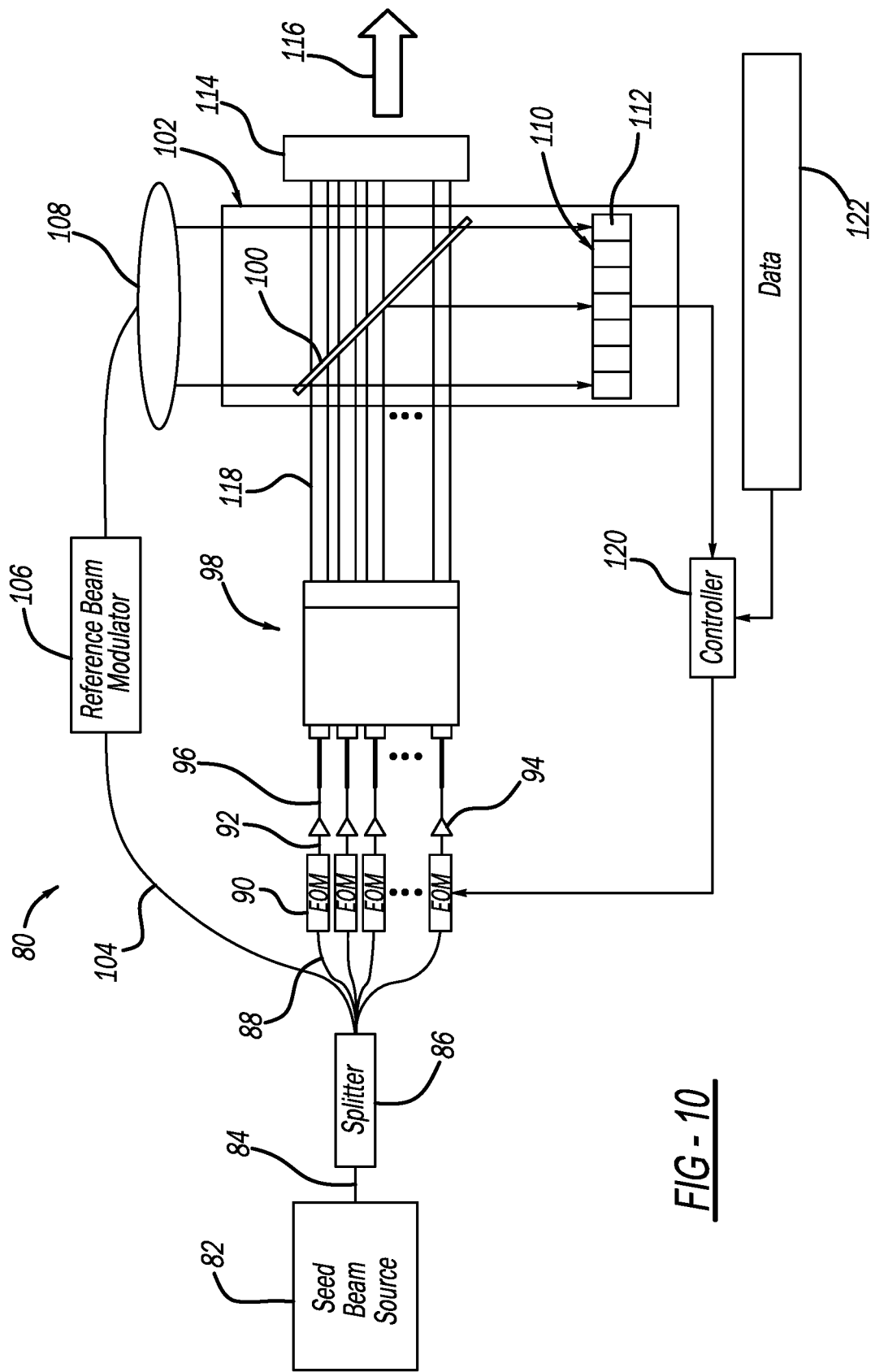
FIG. 10 is a schematic block diagram of a CBC fiber laser amplifier system that includes a beam combiner array assembly.

FIG. 10 is a schematic block diagram of a CBC fiber laser amplifier system 80 that includes a seed beam source 82 that generates a continuous wave frequency-modulated seed beam having a center wavelength λ on a fiber 84. The source 82 may include a master oscillator (MO), such as a single-longitudinal mode distributed feedback (DFB) diode laser oscillator, and a frequency modulator, such as an electro-optical modulator (EOM). The EOM may receive an applied voltage provided by an amplified radio frequency (RF) electrical drive signal from an RF source (not shown) that provides frequency modulation broadening, such as white noise or pseudo-random bit sequence (PRBS), so that the modulated seed beam has a linewidth that is substantially broadened, which suppresses stimulated Brillouin scattering in a downstream high power fiber amplifier. The modulated seed beam on the fiber 84 is split by an optical splitter 86 to produce a plurality of split seed beams on fibers 88 having the same wavelength λ, where each split seed beam is sent to a separate EOM 90 that provides servo-phase control of the seed beams for phase-locking purposes.

Each of the modulated seed beams is provided on a fiber 92 and sent to a fiber amplifier 94, such as a Yb-doped fiber amplifier, where the amplifier 94 will typically be a doped amplifying portion of the fiber 92 that receives an optical pump beam (not shown). All of the amplified beams are directed onto hollow core fibers 96 and sent to a beam combiner array assembly 98 of the type discussed above that operates as a beam emitter. The emitted amplified beams 118 from the beam combiner array assembly 98 are directed as a combined amplified beam through a beam splitter 100 in a phase sensing assembly 102 that samples off a sample portion of each of the separate beams in the combined beam. The optical splitter 86 is configured to also generate a reference beam 104 that is sent to a reference beam modulator 106 that modulates the reference beam 104. The reference beam modulator 106 could include, for example, an acousto-optic modulator that shifts the center frequency of the reference beam 104, or an EOM that imparts a digital phase shift to the reference beam 104. The modulated reference beam 104 is expanded by a beam expander 108 to provide a flat wavefront and to overlap with the combined amplified beam on the beam splitter 100. The intensities of the overlapped reference and sample beams are detected by an array 110 of photodetectors 112. The main part of the combined amplified beam is sent to a beam director telescope 114 that directs an output beam 116 to a target (not shown).

The electrical signals from the photodetectors 112 are used by a phase locking controller 120 to control the EOMs 90 to correct the phase of the seed beams, using, for example, a phase-locking technique, such as optical heterodyne detection (OHD), well known to those skilled in the art. However, other phase-locking techniques (not shown) can be employed that may not require a frequency shifted reference beam, or instead using a far-field generating lens that focuses the entire beam array onto a single detector, where error signals for each channel are extracted electrically using a variety of multi-dither approaches, such as, for example, a stochastic parallel gradient decent (SPGD) algorithm, well known to those skilled in the art. The controller 120 may receive other data and information provided by box 122 to determine the phase set-points, such as wavefront aberration data or beam steering set-points. More particularly, the controller 120 provides error signals of the phase difference between the sampled beams, and provides those error signals to the EOMs 90 to control the phases of the individual seed beams so that all of the seed beams are locked in phase. In other words, the EOMs 90 provide seed beam phase control so that a "piston" phase of the combined amplified beam is spatially uniform across the beam wavefront. This also allows the phases of the seed beams to be altered relative to each other for electronic beam steering purposes. The controller 120 can also impart phase control of the beams to correct for measured atmospheric anomalies where the output beam 116 may have wavefront aberrations that are corrected as a result of propagating through the atmospheric aberrations so that the beam 116 is of the desired quality when it impinges the target.

Figure 11:
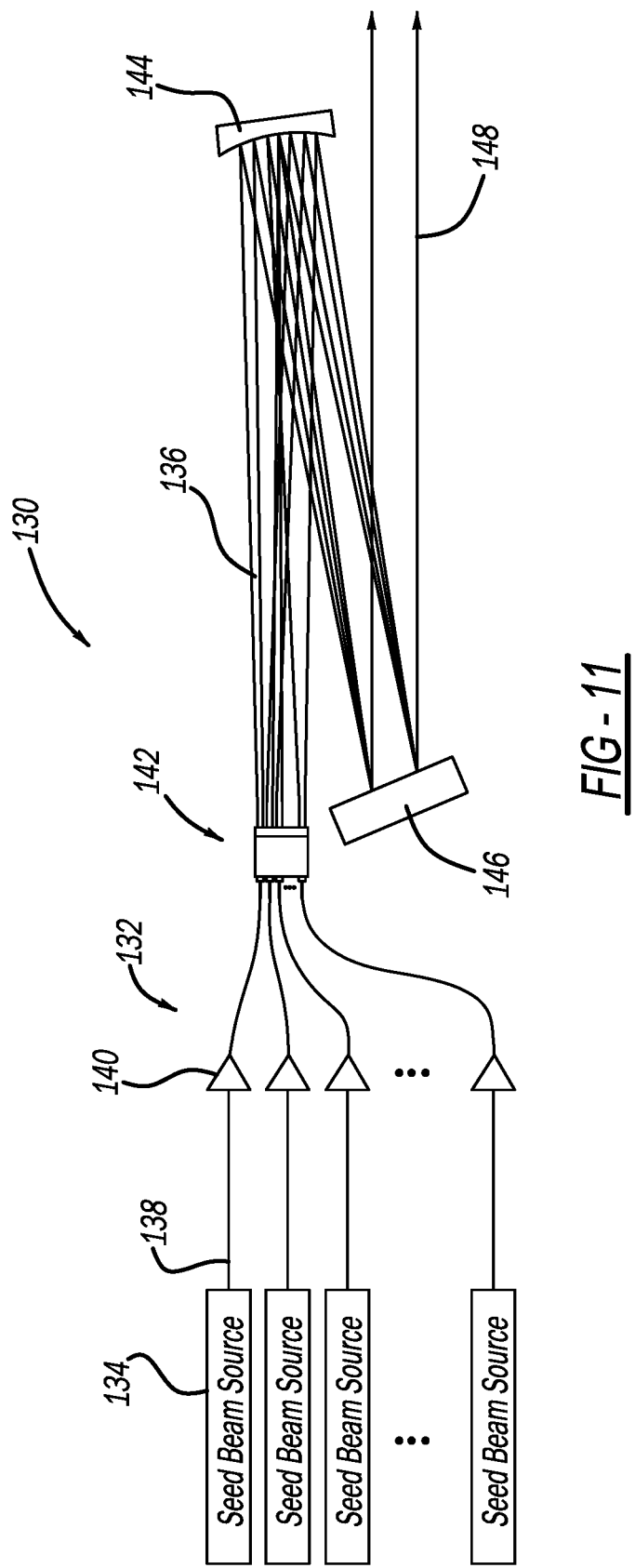
FIG. 11 is a schematic block diagram of an SBC fiber laser amplifier system that includes a beam combiner array assembly.

FIG. 11 is a schematic block diagram of an SBC fiber laser amplifier system 130 that includes N number of wavelength channels 132 each having a seed beam source 134 that generates a continuous wave frequency-modulated seed beam having a center wavelength λ on a fiber 138 for the particular channel 132, where each seed beam source 134 generates a different beam wavelength $\lambda_1$-$\lambda_N$. Each of the seed beams on the fibers 138 is sent to a fiber amplifier 140, such as a Yb-doped fiber amplifier, where the amplifier 140 will typically be a doped amplifying portion of the fiber 138 that receives an optical pump beam (not shown). All of the amplified beams are directed to a one-dimensional beam combiner array assembly 142 that is similar to the beam combiner array assembly 98, but does not provide phase locking as discussed above because all of the beams have different wavelengths. The beams 136 from the assembly 142 are reflected off of a set of collimating optics 144 that collimates the diverse beams 136 and directs them onto an SBC grating 146 so that all of the individual beams 136 impact the grating 146 and overlap on the same footprint. The grating 146 spatially diffracts the individual beam wavelengths $\lambda_1$-$\lambda_N$ and directs the individual amplified beams in the same direction as a combined output beam 148.

SBC beam quality is limited by angular dispersion from the diffraction grating 146. Since the individual fiber amplifiers have a finite optical linewidth owing to frequency modulation, power will be spread into different directions following diffraction from the diffraction grating 146. If the span of these different directions is significant compared to the diffraction limited angle, then the beam quality will degrade. The degradation in beam quality can be minimized by decreasing the size of the beam footprint on the grating 146 along the combining dispersive axis, which increases the diffraction limited angle. Since the grating 146 is at a Fourier plane of the assembly 142, this corresponds to an increase in the individual beam sizes at the assembly 142. Hence, a high spatial fill factor along the combining axis of the assembly 142 provides improved beam quality. With an array of Gaussian beams, the fill factor at the assembly 142 cannot be increased without clipping the wings of the Gaussian beams leading to lost power. With an array of shaped high fill factor beams, for example, an array of hyper-Gaussian shaped beams, the spatial fill factor of the beam combiner array assembly 142 can be increased without incurring clipping losses, thus leading to improved beam quality without loss of power.

For the SBC configuration of the laser system 130, the shape of the beams output from the beam combiner array assembly 142 will optimally be identical for all of the beams. However, the beam shapes may be different along the combining and the non-combining axes. Along the combining axis the beams may be shaped to provide a higher fill factor to minimize beam quality loss due to angular dispersion. Along the non-combining axis, the beams may, for example, be left unshaped to generate a near-Gaussian beam profile on the grating 146. This can be advantageous to maximize power on a far-field target whose size is between 1× and 2× diffraction-limited (DL), since it minimizes power diffracted into far-field sidelobes at angles larger than 2× diffraction-limited. Alternatively, the beams may be shaped along the non-combining axis to generate a high fill factor profile on the grating 146, with intensity tapering to near zero at the telescope aperture. This can be advantageous to fully fill a beam director telescope to maximize far-field peak intensity on a target whose size is less than 1× diffraction-limited while minimizing clipping losses on the telescope aperture. The dispersive impact of the grating 146 can be minimized on output beam quality by choosing the beam combiner array assembly 142 and the set of collimating optics 144 so that the shaped beams incident on the grating 146 are narrow in the dispersive direction, but wider in the orthogonal non-dispersive direction. This asymmetric configuration lowers the peak irradiance on the grating 146 while also minimizing the degradation of the combined beam quality.

The number of beams that can be combined in both SBC and CBC architectures is limited for other reasons. In particular, the one-dimensional linear fiber array required for SBC may be impractically large. However, the limitations of providing CBC and SBC combined beams can be increased by a hybrid fiber laser amplifier architecture that combines both CBC and SBC architectures. This can be accomplished by providing CBC combined beams in one direction and SBC combined beams in an orthogonal direction. This combined CBC and SBC architecture can then be improved with the beam fill factor provided by the beam shaper array assembly 98 or the beam shaper array assembly 142 discussed above.

Figure 12:
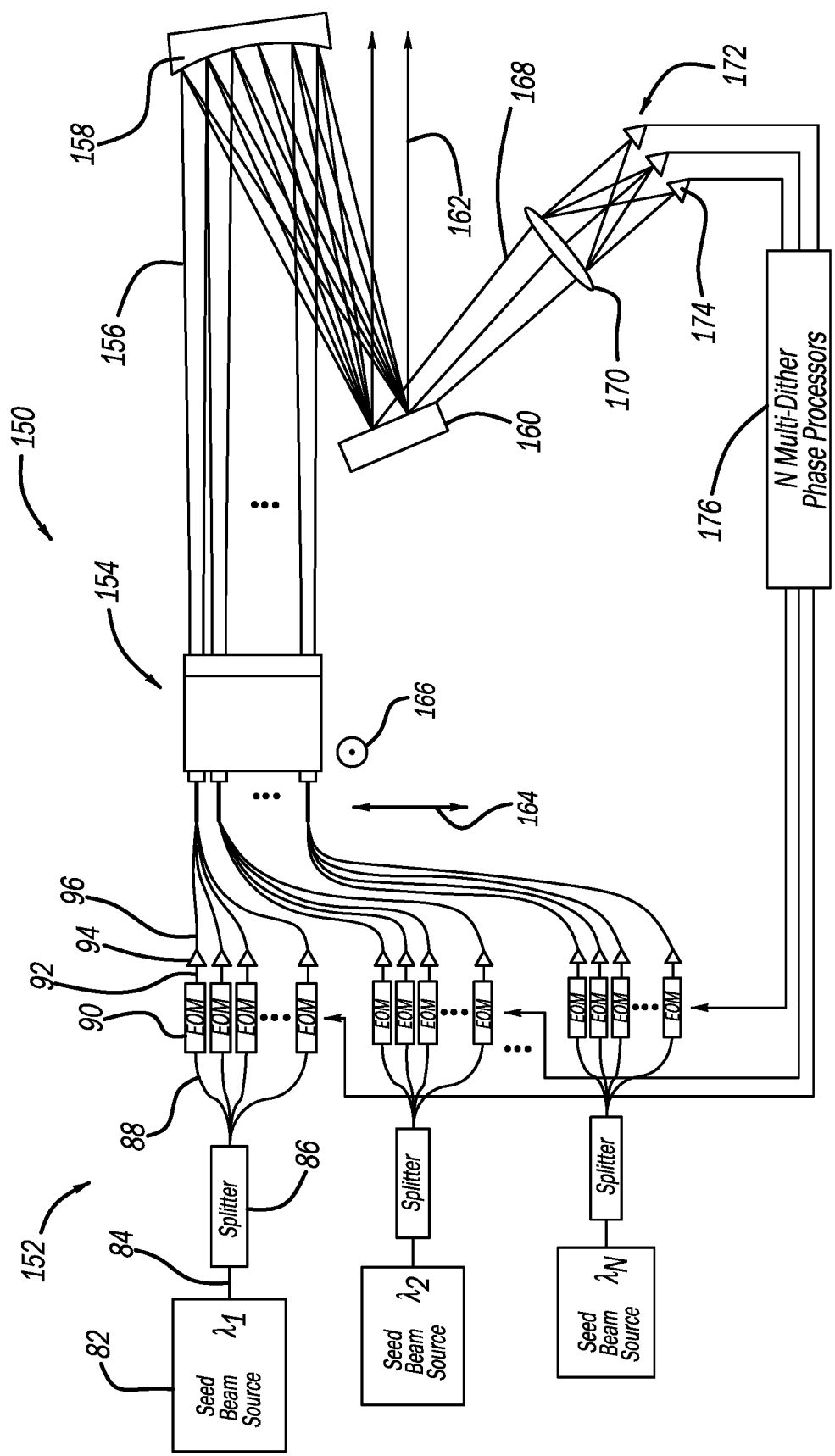
FIG. 12 is a schematic block diagram of a hybrid CBC and SBC fiber laser amplifier system that includes a beam combiner array assembly and multi-dithered sample beam phase-locking.

Several architectures can be employed to measure the beam phases in a hybrid CBC and SBC fiber laser amplifier system. FIG. 12 is a schematic block diagram of a hybrid CBC and SBC fiber laser amplifier system 150 illustrating one such architecture, where like elements to the system 80 are identified by the same reference number. The system 150 includes N number of SBC channels 152, where each channel 152 includes a separate grouping of the seed beam source 82 having wavelength $\lambda_i$, where i is in the range $1 \leq i \geq N$, the splitter 86, the EOMs 90 and the amplifiers 94 as shown in the system 80. As such, the ith channel 152 includes a single wavelength $\lambda_i$ seed beam that is split into M multiple seed beams that are separately amplified and of the same wavelength $\lambda_i$, where there are N groups of M EOMs 90 and all of the channels 152 together generate M×N seed beams that are amplified at each of the different beam wavelengths $\lambda_1$-$\lambda_N$. All of the M×N fibers 96 are coupled to a beam combiner array assembly 154 that outputs M×N output beams 156.

The M×N beams 156 from the beam combiner array assembly 154 are collimated by a cylindrical optical system 158 and directed onto a diffraction grating 160 that operates in a similar manner to the diffraction grating 142. The optical system 158 has curvature along the dispersive SBC axis 164 in the plane of the page. The focal length of the optical system 158 is selected to ensure that all of the N different wavelengths $\lambda_i$ are incident at the correct angles to the grating 160 such that all of the diffracted output beams from the grating 160 are co-propagating in the same direction with the highest precision possible. As a result, a combined output beam 162 from the grating 160 comprises M parallel beams tiled along the CBC axis 166, which is orthogonal to the page, and will have phase control of the individual beams along one axis and spatially diffracted beams along a perpendicular axis.

Also reflected from the grating 160 is a weak specular $0^{th}$ order beam 168, which is focused by a lens 170 onto a detector array 172 having individual detectors 174. Because the wavelength groups comprising the beam 168 propagate at different angles in a linear array, the focused beams from the lens 170 for each wavelength group are separated along a line and can be directed to a linear array of the detectors 174. Each of the N detectors 174 receives the overlap of the M focused CBC beams comprising each wavelength group. The intensity on each detector 174 is maximized by a multi-dither processor 176 that provides dither signals superimposed with phase-locking control signals to the corresponding EOMs 90 for each wavelength group using, for example, an SPGD algorithm.

Figure 13:
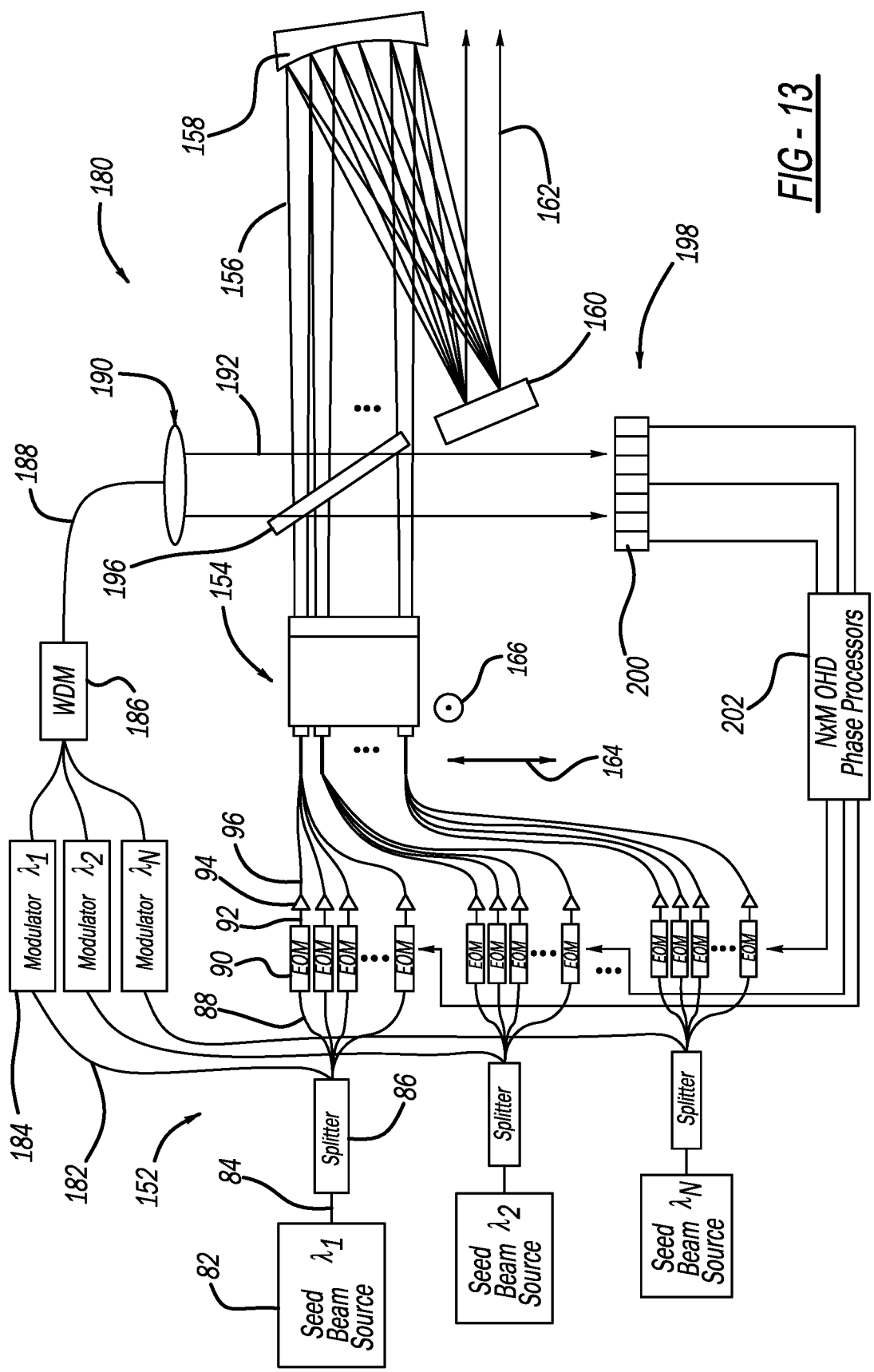
FIG. 13 is a schematic block diagram of another hybrid CBC and SBC fiber laser amplifier system that includes a beam combiner array assembly and optical heterodyne detection phase-locking.

FIG. 13 is a schematic block diagram of another hybrid CBC and SBC fiber laser amplifier system 180 that is similar to the amplifier system 150, except for phase sensing and control features, where like elements to the system 150 are identified by the same reference number. In this embodiment, the splitters 86 provide a reference beam 182 to be used as a reference for each wavelength group. Each reference beam 182 is modulated by a modulator 184, and all of the modulated reference beams 182 are combined by a wavelength division multiplexer (WDM) 186 onto a single fiber 188, and then collimated by a lens 190 to form a large multi-color planar reference beam 192. The planar reference beam 192 is combined by sample optics 196 with a small sample of the M×N beams 156 transmitted from the beam combiner array assembly 154.

The combined reference beam 192 and the sampled M×N beams 156 are received by a 2D M×N detector array 198 including individual detectors 200, where wavelength filters (not shown) may be employed in the array 198 to eliminate noise from the reference beams 192 having wavelengths other that the correct wavelength $\lambda_i$ intended for a given detector 200. Alternately, the detector array 198 can be AC-coupled to reject DC photocurrent arising from the reference beams having wavelengths other than the correct wavelength intended for a given detector 200. The heterodyne interference signal from each detector 200 in the array 198 is transmitted to an OHD processor 202 that provides phase correction signals to the EOMs 90 to phase lock each group of M beams at each wavelength $\lambda_i$.

It is noted that although the laser amplifier systems 150 and 180 provide specific phase control approaches, this is non-limiting in that other approaches may be suitable. The essential element in the hybrid fiber laser amplifier systems 150 and 180 is that the CBC beams need to be phase locked together with the desired phase profile similar to the system 10. The essential difference in the hybrid systems 150 and 180 is that the CBC beam is only in one dimension, since the beams in the other dimension are spectrally combined.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for assembling a beam combiner array, said method comprising:
 providing an array block including a back wall having a thickness and a front surface, said array block including a plurality of aligned channels extending from the back wall to the front surface, wherein a bore extends through the back wall and into each channel;

providing a lens array including a plurality of lenses;
securing the lens array to the front surface of the block so that one of the lenses is aligned with each channel;
threading a separate hollow core fiber through one of the bores in the back wall so that an end of the fiber is positioned within the channel;
threading each fiber through a bore in a fiber flange prior to threading the fiber through the bore in the back wall;
aligning each fiber to the lens array in an x-y-z direction so that a beam that propagates down the fiber is emitted into the channel, focused by the lens and emitted from the array as a collimated beam; and
securing the fiber to the fiber flange and the fiber flange to the back wall after aligning each fiber to the lens array.

2. The method according to claim 1 further comprising cleaving an end of each fiber after the fiber is threaded through the bore in the flange but prior to the fiber being threaded through the bore in the back wall.

3. The method according to claim 1 wherein securing the fiber to the fiber flange, securing the fiber flange to the back wall and securing the lens assembly to the block includes using glue.

4. The method according to claim 3 wherein securing the fiber flange to the back wall includes moving the flange until it contacts the back wall, moving the flange away from the back wall a distance equal to the thickness of the glue, gluing the fiber to the flange and then gluing the flange to the back wall.

5. The method according to claim 1 wherein threading a separate hollow core fiber through one of the bores in the back wall includes threading the hollow core fiber so that it doesn't touch the block.

6. The method according to claim 1 wherein aligning each fiber to the lens array includes using laser beam diagnostics equipment.

7. The method according to claim 1 wherein the channels are filled with air or other gas.

8. The method according to claim 1 wherein the assembly is configured to form a 1D array of fibers.

9. The method according to claim 1 wherein the assembly is configured to form a 2D array of fibers.

10. The method according to claim 1 wherein the block is a glass block and the lens array is a glass lens array.

11. The method according to claim 1 wherein centers of the lens in the lens array are spaced between 1 and 2 mm apart.

12. The method according to claim 1 wherein the array is a beam emitter in a spectral beam combining (SBC), a coherent beam combining (CBC) fiber laser amplifier system or a hybrid SBC and CBC fiber laser amplifier system.

13. A method for assembling a beam combiner array, said method comprising:
providing an array block including a back wall having a thickness and a front surface, said array block including a plurality of aligned channels extending from the back wall to the front surface, wherein a bore extends through the back wall and into each channel;
providing a lens array including a plurality of lenses;
providing a plurality of fiber flanges;
securing the lens array to the front surface of the block so that one of the lenses is aligned with each channel;
threading a separate hollow core fiber through a bore in each fiber flange;
cleaving an end of each fiber after the fiber is threaded through the bore in the flange;
threading each fiber through one of the bores in the back wall so that an end of the fiber is positioned within the channel;
aligning each fiber to the lens array in an x-y-z direction; and
securing the fiber to the fiber flange and the fiber flange to the back wall after aligning each fiber to the lens array.

14. The method according to claim 13 wherein securing the fiber to the fiber flange, securing the fiber flange to the back wall and securing the lens assembly to the block includes using glue.

15. The method according to claim 14 wherein securing the fiber flange to the back wall includes moving the flange until it contacts the back wall, moving the flange away from the back wall a distance equal to the thickness of the glue, gluing the fiber to the flange and then gluing the flange to the back wall.

16. The method according to claim 13 wherein threading the fiber through one of the bores in the back wall includes threading the hollow core fiber so that it doesn't touch the block.

17. A method for assembling an optical device, said method comprising:
threading a hollow core fiber through a bore and into a channel in an optical block so that an end of the fiber is positioned within the channel; and
aligning each fiber to a lens coupled to the block in an x-y-z direction so that a beam that propagates down the fiber is emitted into the channel, focused by the lens and emitted from the device, wherein aligning each fiber to the lens includes using laser beam diagnostics equipment.

18. The method according to claim 17 wherein threading a hollow core fiber includes threading a plurality of hollow core fibers through a bore and into a separate channel in the optical block and aligning each fiber to a lens includes aligning the fibers to a lens array.

19. A method for assembling a beam combiner array, said method comprising:
providing an array block including a back wall having a thickness and a front surface, said array block including a plurality of aligned channels extending from the back wall to the front surface, wherein a bore extends through the back wall and into each channel;
providing a lens array including a plurality of lenses;
securing the lens array to the front surface of the block so that one of the lenses is aligned with each channel;
threading a separate hollow core fiber through one of the bores in the back wall so that an end of the fiber is positioned within the channel; and
aligning each fiber to the lens array in an x-y-z direction so that a beam that propagates down the fiber is emitted into the channel, focused by the lens and emitted from the array as a collimated beam, wherein aligning each fiber to the lens array includes using laser beam diagnostics equipment.

* * * * *